(12) United States Patent
Hoehn

(10) Patent No.: US 8,878,170 B2
(45) Date of Patent: Nov. 4, 2014

(54) OPTOELECTRONIC SEMICONDUCTOR DEVICE

(75) Inventor: Klaus Hoehn, Forcheim (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 13/885,659

(22) PCT Filed: Nov. 8, 2011

(86) PCT No.: PCT/EP2011/069672
§ 371 (c)(1),
(2), (4) Date: Jul. 30, 2013

(87) PCT Pub. No.: WO2012/065882
PCT Pub. Date: May 24, 2012

(65) Prior Publication Data
US 2013/0307015 A1  Nov. 21, 2013

(30) Foreign Application Priority Data
Nov. 19, 2010  (DE) .......................... 10 2010 051 959

(51) Int. Cl.
| | |
|---|---|
| *H01L 35/24* | (2006.01) |
| *H01L 51/00* | (2006.01) |
| *H01L 33/62* | (2010.01) |
| *H01L 33/48* | (2010.01) |

(52) U.S. Cl.
CPC ............... *H01L 33/62* (2013.01); *H01L 33/486* (2013.01); *H01L 2224/48091* (2013.01)
USPC ....................... 257/40; 257/698; 257/E39.007

(58) Field of Classification Search
USPC ............. 257/40, 668, 698, 724, 728, E39.007
See application file for complete search history.

(56) References Cited

U.S. PATENT DOCUMENTS

| | | | |
|---|---|---|---|
| 2008/0057333 A1 | 3/2008 | Chu et al. | |
| 2008/0100772 A1 | 5/2008 | Lin et al. | |
| 2009/0122541 A1 | 5/2009 | Suehiro et al. | |
| 2012/0187548 A1* | 7/2012 | Kugler | 257/632 |

FOREIGN PATENT DOCUMENTS

| | | |
|---|---|---|
| DE | 102 34 978 A1 | 2/2004 |
| JP | 2006-324297 A | 11/2006 |
| JP | 2007231072 A | 9/2007 |
| WO | 2008/042110 A2 | 4/2008 |
| WO | 2010/019459 A2 | 2/2010 |

* cited by examiner

*Primary Examiner* — Hoai V Pham
(74) *Attorney, Agent, or Firm* — Slater & Matsil, L.L.P.

(57) ABSTRACT

An optoelectronic semiconductor device has a carrier foil that includes a first surface and a second surface opposite the first surface. At least one electrically conductive contact layer is arranged on the first surface and covers the first surface in places and contains at least one metal. At least one radiation-emitting optoelectronic semiconductor component is arranged on an outer face, remote from the carrier foil, of the electrically conductive contact layer. The radiation-emitting, optoelectronic semiconductor component is electrically conductively connected to the at least one electrically conductive contact layer. The carrier foil is formed with at least one polymer or contains at least one polymer. At least one monomer of the polymer is formed with at least one C—F bond, with C denoting carbon and F fluorine.

17 Claims, 3 Drawing Sheets

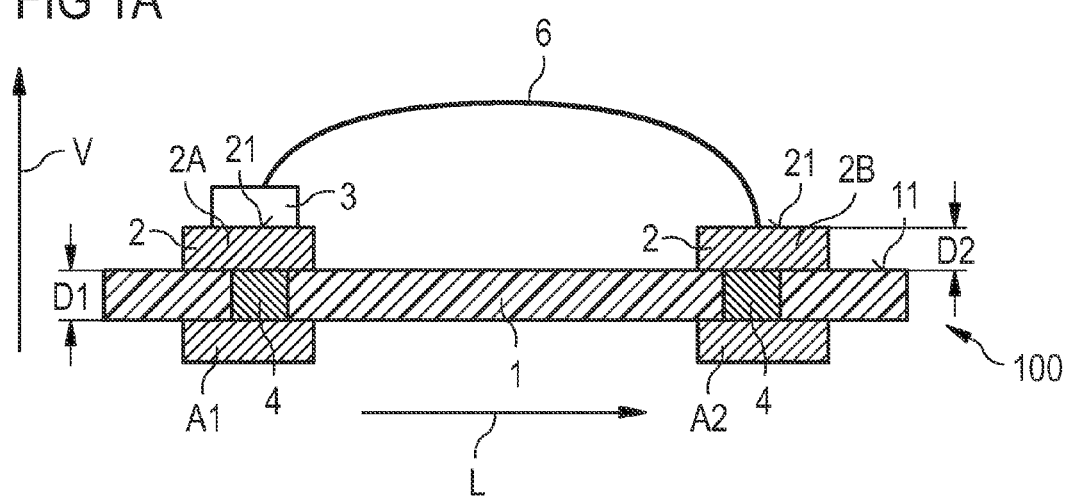
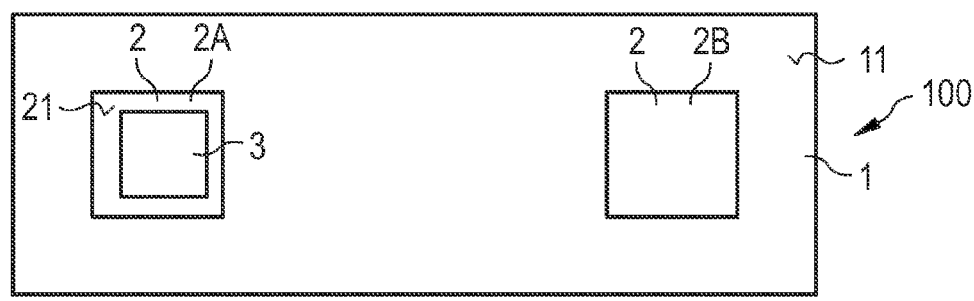

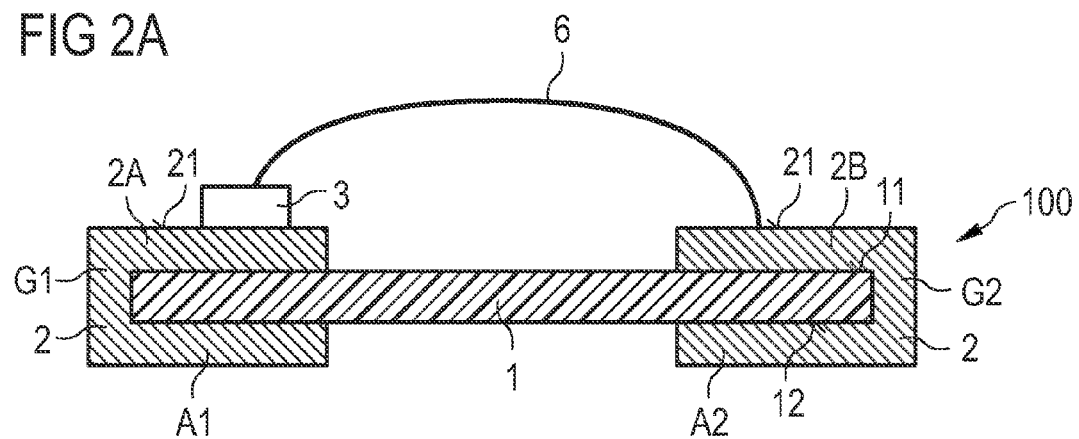
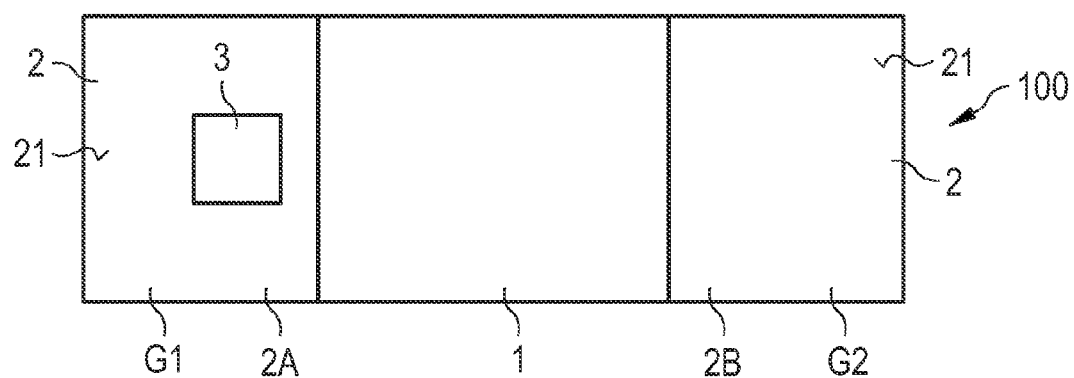

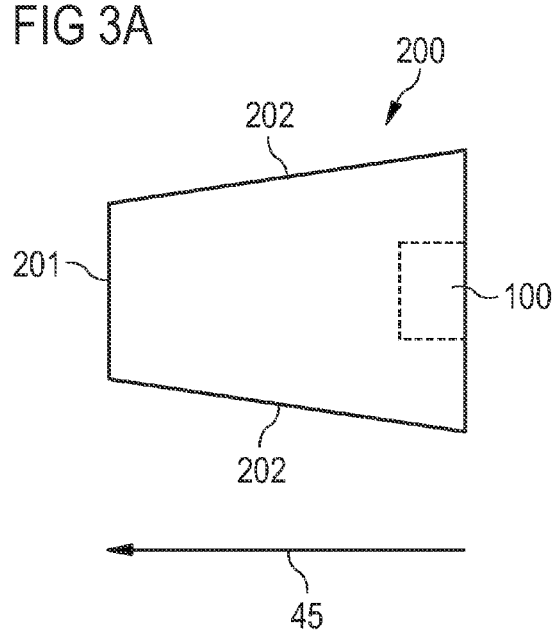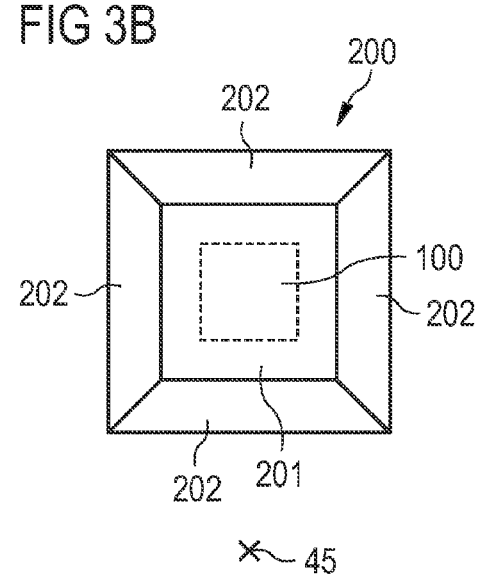

OPTOELECTRONIC SEMICONDUCTOR DEVICE

This patent application is a national phase filing under section 371 of PCT/EP2011/069672, filed Nov. 8, 2011, which claims the priority of German patent application 10 2010 051 959.6, filed Nov. 19, 2010, each of which is incorporated herein by reference in its entirety.

TECHNICAL FIELD

An optoelectronic semiconductor device and a signal light with such an optoelectronic semiconductor device are specified.

SUMMARY OF THE INVENTION

Embodiments of the invention provide an optoelectronic semiconductor device that is flexible to use and in which material damage to the device during operation of the optoelectronic semiconductor device may be avoided.

According to at least one embodiment, an optoelectronic semiconductor device comprises at least one carrier foil, the carrier foil comprising a first surface and a second surface opposite said first surface. The carrier foil may be a mechanically stable carrier, on the first and/or second surfaces of which components of the semiconductor device may be arranged and fastened. In other words, the carrier foil may be of a nature such that it is self-supporting and constitutes a stable base for mounting and/or carrying the components. This may mean that the carrier foil itself requires no further fastening and stabilizing measures in the semiconductor device. For example, the carrier foil is flexible, e.g., it may be rolled up and unrolled again. In those areas in which the carrier foil is rolled up or bent, it preferably exhibits neither breakage points nor unevennesses or the like.

The first surface and the second surface are part of the outer faces of the carrier foil. In the mounted state of the carrier foil, the second surface may here face a contact carrier, for example, a printed circuit board. For example, the second surface is a mounting face which may serve to mount the optoelectronic semiconductor component on a contact carrier.

According to at least one embodiment of the optoelectronic semiconductor device, the latter comprises at least one electrically conductive contact layer which is arranged on the first surface, covers the first surface in places and contains at least one metal. This may mean that the electrically conductive contact layer is applied directly onto the first surface of the carrier foil and, at these points, is in direct contact with the first surface. The electrically conductive contact layer may here be formed with a plurality of individual segments which are separate from one another and electrically insulated from one another. For example, the individual segments are electrically insulated from one another by the carrier foil.

According to at least one embodiment, at least one further electrically conductive contact layer covers the second surface of the carrier foil at least in places. In this case, the carrier foil may be arranged between the two contact layers when viewed in a lateral sectional representation of the component. The materials of the electrically conductive contact layer and of the further electrically conductive contact layer are, for example, identical.

According to at least one embodiment of the optoelectronic semiconductor device, the latter comprises at least one radiation-emitting, optoelectronic semiconductor component which is arranged on an outer face, remote from the carrier foil, of the electrically conductive contact layer. The radiation-emitting, optoelectronic semiconductor component, for example, comprises a radiation-emitting semiconductor chip. The semiconductor chip is, for example, a luminescent diode chip. The luminescent diode chip may be a light-emitting diode chip or a laser diode chip.

According to at least one embodiment of the optoelectronic semiconductor device, the radiation-emitting, optoelectronic semiconductor component is electrically conductively connected to the at least one electrically conductive contact layer. To this end, the radiation-emitting, optoelectronic semiconductor component may be applied, for example, adhesively bonded, for example directly onto the outer face, remote from the carrier foil, of the electrically conductive contact layer. The electrically conductive contact layer serves to electrically contact the radiation-emitting, optoelectronic semiconductor component.

According to at least one embodiment of the optoelectronic semiconductor device, the carrier foil is formed with at least one polymer or contains at least one polymer, wherein at least one monomer of the polymer is formed with at least one C—F bond, with C denoting carbon and F fluorine. This means that at least one fluorine atom is a fundamental chemical element of at least one monomer of the polymer and not merely an optional, substitutable additional chemical element of the monomer. For example, to form a polymer, fluorine is present in each monomer of the polymer. If the polymer is a copolymer, it is also possible for just one or two or more monomers of one monomer type of the polymer to be formed with at least one C—F bond. In other words, the fluorine serves to form polymerization chains, which form the material of the carrier foil.

According to at least one embodiment, the optoelectronic semiconductor device comprises a carrier foil which has a first surface and a second surface opposite said first surface. The optoelectronic semiconductor device further comprises at least one electrically conductive contact layer which is arranged on the first surface, covers the first surface in places and contains at least one metal. In addition, the optoelectronic semiconductor device comprises at least one radiation-emitting, optoelectronic semiconductor component which is arranged on an outer face, remote from the carrier foil, of the electrically conductive contact layer, the radiation-emitting, optoelectronic semiconductor component being electrically conductively connected to the at least one electrically conductive contact layer. The carrier foil is formed with at least one polymer or contains at least one polymer, wherein one monomer of the polymer is in each case formed with at least one C—F bond and C denotes carbon and F fluorine.

The optoelectronic semiconductor device described herein is based, inter alia, on the recognition that carrier elements of an optoelectronic semiconductor device, on which a radiation-emitting, optoelectronic semiconductor component is arranged, may be damaged by the electromagnetic radiation emitted by the radiation-emitting, optoelectronic semiconductor component. If such a carrier element is, for example, formed with an epoxide, the electromagnetic radiation, for example, in a wavelength range of wavelengths less than 460 nm, impinging on the carrier element may give rise to corrosive degradation products in or on the carrier element which may, for example, lead during operation of the optoelectronic semiconductor device to damage to the carrier, to solder points of the radiation-emitting, optoelectronic semiconductor component and to the semiconductor component itself. In addition, such carrier elements have only slight resistance to heat, radiation and weathering. For example, even after a short operating period both the carrier element and the radiation-emitting, optoelectronic semiconductor component may appear yellowed and/or brownish to an external observer.

Although such corrosive degradation products may be prevented, for example, by using ceramic carrier materials for such a carrier element, ceramic carrier materials exhibit only limited flexible properties and additionally are not cheap.

In order to provide an optoelectronic semiconductor device in which such troublesome corrosive degradation products are prevented and which exhibits high heat, radiation and weathering resistance, and at the same time is both flexible to use and inexpensive to produce, the optoelectronic semiconductor device described herein makes use, inter alia, of the concept of providing a carrier foil which is formed of at least one polymer or contains at least one polymer, wherein at least one monomer of the polymer is formed with at least one C—F bond, C denoting carbon and F fluorine. Advantageously, when such polymers formed with fluorine are used as the material for the carrier foil, the latter exhibits neither yellowing nor troublesome brown discoloration on irradiation with electromagnetic radiation, i.e., using carrier foils formed with such materials prevents troublesome corrosive degradation products. In addition, said carrier foil materials exhibit flexible mechanical properties. For example, depending on requirements and the application to which the optoelectronic semiconductor device is to be put, the carrier foil may be rolled up or pre-determinably bent. In addition, such materials exhibit low outgassing rates on irradiation with electromagnetic radiation. Moreover, the carrier foil described herein may result in the cheapest possible production by reel-to-reel or rigid mounting of the semiconductor component on the electrically conductive contact layer. At the same time, rapid switching cycles are enabled for pulsed operation of the semiconductor component.

According to at least one embodiment of the optoelectronic semiconductor device, the radiation-emitting, optoelectronic semiconductor component generates electromagnetic radiation when in operation, which impinges on the first surface of the carrier foil, the first surface being formed with the polymer. The carrier foil extends vertically. The outer faces of the carrier foil are formed in particular by the first surface and the second surface, wherein in operation electromagnetic radiation impinges predominantly on the first surface of the carrier foil. The bulk of the carrier foil, the first and second surfaces form outer faces and are formed at least by the same polymer or contain at least the same polymer. In other words, the outer faces of the carrier foil are not protected by a further, in particular radiation-resistant material, for example, a metal foil, i.e., the carrier foil also comprises the polymer at its outer faces, which polymer is in itself particularly radiation-resistant, in particular with regard to blue light and/or UV radiation.

According to at least one embodiment of the optoelectronic semiconductor device, the carrier foil is reflective and in particular appears white. In addition to the polymer, the carrier foil comprises for example particles, which may inter alia have a reflective effect on the electromagnetic radiation. The particles pass through the polymer at least in places and are in particular distributed homogeneously in the carrier foil. "Homogeneously" is understood in the present context to mean that the particles do not accumulate locally within the carrier foil. In other words, the particles are distributed uniformly through the carrier foil. The particles consist, for example, of at least one of the following materials $TiO_2$, $BaSO_4$, $ZnO$, $Al_xO_y$, $ZrO_2$, or contain one of said materials, $ZrO_2$ having particularly low absorption characteristics with regard to blue light, i.e., very good reflection characteristics. Moreover, the carrier foil in particular appears white. In particular, the carrier foil appears white over the entire service life of the optoelectronic semiconductor component, since it is particularly resistant to heat, radiation and weathering and does not change color when in operation. The carrier foil is in particular resistant to electromagnetic radiation in the wavelength range of less than 460 nm. In other words, the carrier foil does not yellow and/or undergo brownish discoloration in operation, even if the electromagnetic radiation impinges directly on the carrier foil.

According to at least one embodiment of the optoelectronic semiconductor device, the polymer is formed with or contains at least one of the following materials: polytetrafluoroethylene, perfluoropropylene, perfluoroalkyl vinyl ether, polychlorotrifluoroethylene or polyvinylidene fluoride. It has been found that said materials are particularly corrosion-resistant when irradiated with electromagnetic radiation and additionally exhibit the desired flexible material properties.

According to at least one embodiment, the carrier foil exhibits a foil thickness of at most 500 μm, preferably of at most 125 μm. Such a thickness range ensures that the flexible, mechanical properties of the carrier foil are retained and the optoelectronic semiconductor device extends only slightly in the vertical direction, i.e., perpendicular to a main direction of extension of the optoelectronic semiconductor device. Such an optoelectronic semiconductor device is therefore particularly flat and compact.

According to at least one embodiment, the electrically conductive contact layer is formed with at least one of the materials Cu, Ag, Au, Ni, Pt, Pd or contains at least one of the stated materials.

According to at least one embodiment, the optoelectronic semiconductor device comprises at least two carrier foils arranged one above the other in the vertical direction, wherein in the vertical direction at least one contact layer or at least one further contact layer is arranged between the carrier foils. For example, a carrier foil and a contact layer or a further contact layer alternate in the vertical direction. In this case, the carrier foils and the contact layers are arranged above one another, for example, in a stack.

According to at least one embodiment, a plurality of optoelectronic semiconductor components are in each case arranged on the outer face, remote from the carrier foil, of the contact layer and on the outer face, remote from the carrier foil, of the further contact layer, the semiconductor components overlapping with one another at least in places in the vertical direction. For example, the semiconductor components arranged on the outer face of the contact layer overlap completely with the semiconductor components associated therewith which are arranged on the outer face of the further contact layer, i.e., opposite. In this case, in each case two semiconductor devices may form a device group which is symmetrical with regard to the lateral direction, i.e., the main axis. Such an optoelectronic semiconductor device is advantageously particularly flexible to use, since, for an external observer, the semiconductor device exhibits illumination characteristics which are as far as possible brought into line with one another both in the direction of view towards the first surface and in the direction of view towards the second surface.

According to at least one embodiment, the thickness of the electrically conductive contact layer amounts at most to the thickness of the carrier foil. Such an upper thickness limit of the electrically conductive contact layer ensures that the radiation-emitting, optoelectronic semiconductor component is, on the one hand, straightforwardly electrically contactable and, on the other hand, the optoelectronic semiconductor device extends as little as possible in the vertical direction.

According to at least one embodiment, the dielectric constant of the carrier foil, in the case of electromagnetic radiation impinging on the carrier foil at a frequency range from 50 Hz to at most 1 kHz, amounts to at least 2.0 and at most 2.2 in the CGS system of units. This means that, thanks to the low dielectric constant, such a carrier foil exhibits particularly low transmissivity for electric fields and/or for the electromagnetic radiation impinging on the carrier foil. Such a dielectric constant may in particular be achieved by the above-described materials for the carrier foil. The low dielectric constant may here ensure that as little as possible of the electromagnetic radiation emitted by the optoelectronic, radiation-emitting semiconductor component penetrates through the carrier foil and outcouples from the optoelectronic semiconductor component, for example, via the second surface, i.e., rear, of the carrier foil. In this respect, thanks to such a carrier foil it is possible to utilize for physical applications the highest possible proportion of the radiation emitted by the semiconductor component.

According to at least one embodiment, the carrier foil has a dielectric dissipation factor $\tan(\delta)$, in the case of electromagnetic radiation impinging with a frequency of 1 MHz on the carrier foil, of at least $0.6 \times 10^{-4}$ and at most $0.8 \times 10^{-4}$. Such a dielectric dissipation factor ensures that as little as possible of the electromagnetic radiation is absorbed by the carrier foil and also in this case, for example, for physical applications of the optoelectronic semiconductor device the greatest possible proportion of the electromagnetic radiation emitted by the semiconductor component is available and may be utilized. In this case too, such a dielectric dissipation factor may be achieved by the above-described materials for the carrier foil.

According to at least one embodiment, the electrically conductive contact layer forms at least one first contact point and at least one second contact point on the first surface, wherein the radiation-emitting, optoelectronic semiconductor component is electrically conductively connected or contactable via the two contact points. If a plurality of radiation-emitting, optoelectronic semiconductor components are arranged, for example, on the outer face, remote from the carrier foil, of the electrically conductive contact layer, a first and at least one second contact point may be associated with each semiconductor component. To this end, for example, a semiconductor component is in each case applied, for example, adhesively bonded or soldered, onto the first contact point. The first contact point here forms a first electrical contact for the semiconductor component. The second contact point may form a second electrical contact for the semiconductor component, the second contact point, for example, being electrically contacted with the semiconductor component by means of a bonding wire contact.

According to at least one embodiment of the optoelectronic semiconductor device, the latter comprises at least two connection points which are arranged on the second surface of the carrier foil and are electrically conductively connected to the contact points. In other words, the connection points and the contact points are arranged on the carrier foil on respective opposite sides of the carrier foil. Each contact point is, for example, associated with at least one connection point. The radiation-emitting, optoelectronic semiconductor component is, for example, externally electrically contacted by way of electrical contacting of the connection points.

According to at least one embodiment of the optoelectronic semiconductor device, the latter comprises at least two vias in the carrier foil which, starting from the first surface in the direction of the second surface, extend completely through the carrier foil, wherein at least one via electrically conductively connects a contact point associated with the via to at least one connection point associated with the contact point. A via is, for example, formed through at least one opening introduced into the carrier foil, in which opening an electrically conductive material is arranged at least in places. The opening comprises at least one continuous, cohesive side face which is formed in places or completely by the carrier foil. The side face extends completely through the carrier foil, from the first surface towards the second surface. The electrically conductive material is, for example, in direct contact both with a contact point and with a connection point associated with the contact point. The electrically conductive material, for example, comprises a metal and/or an electrically conductive adhesive. In other words, a connection point, a via and a contact point associated with the connection point may form a contacting group for electrically contacting the radiation-emitting, optoelectronic semiconductor component.

According to at least one embodiment, each contact point is directly electrically conductively connected to the connection point associated therewith. This means that the contact point, together with the connection point associated therewith, forms a unit and is formed cohesively therewith. "Directly" means in this connection that an electrically conductive connection is created between a connection point and a contact point associated with the connection point without, for example, a conductor track arranged between the connection point and the contact point. To this end, the connection point and the contact point are, for example, applied onto the outer faces of the carrier foil in a single method step. The connection points and the contact point are, for example, formed from the same material.

The invention further relates to a signal light.

According to at least one embodiment, the signal light comprises at least one optoelectronic semiconductor device, as is described in one or more of the embodiments described herein. This means that the features listed for the optoelectronic semiconductor device described herein are also disclosed for the signal light described herein and vice versa.

According to at least one embodiment, the signal light comprises at least one projection surface, on which the electromagnetic radiation coupled out of the optoelectronic semiconductor device impinges. The projection face is, for example, an at least partially radiation-transmissive shade. This shade is for example integrated into a reflecting and/or radiation-outcoupling means of the signal light. Light coupled out of the optoelectronic semiconductor device may impinge on the projection surface and at least in part be coupled thereby out of the signal light.

The signal light is, for example, a motor vehicle headlamp or used in a motor vehicle headlamp.

The signal light may likewise be a motor vehicle rear light or be used in a motor vehicle rear light.

The signal light may further be a reading light or be used in a reading light.

BRIEF DESCRIPTION OF THE DRAWINGS

The optoelectronic semiconductor device described herein is explained in greater detail below with reference to exemplary embodiments and the associated figures.

FIGS. 1A, 1B, 2A and 2B are schematic views of exemplary embodiments of an optoelectronic semiconductor device described herein; and FIGS. 3A and 3B are schematic views of an exemplary embodiment of a signal light described herein.

In the exemplary embodiments and figures, identical or identically acting components are in each case provided with

DETAILED DESCRIPTION OF ILLUSTRATIVE EMBODIMENTS

FIG. 1A shows a schematic side view of an optoelectronic semiconductor device 100 described herein with a carrier foil 1. The carrier foil 1 comprises a first surface 11 and a second surface 12 opposite the first surface 11. The carrier foil 1 is here formed with at least one polymer or contains at least one polymer. In the present case, in each case one monomer of the polymer is formed with at least one C—F bond, with C denoting carbon and F fluorine. In particular, the polymer may be a material which is formed with or contains at least one of the following materials: polytetrafluoroethylene, perfluoropropylene, perfluoroalkyl vinyl ether, polychlorotrifluoroethylene, polyvinylidene fluoride. The carrier foil 1 has a foil thickness D1 of at most 500 µm, more preferably of at most 125 µm. The dielectric constant c of the carrier foil 1, in the case of electromagnetic radiation impinging on the carrier foil 1 at a frequency range of from at least 50 Hz to at most 1 kHz, amounts to at least 2.0 and at most 2.2 in the CGS system of units. The dielectric dissipation factor $\tan(\delta)$, in the case of electromagnetic radiation impinging with a frequency of 1 MHz on the carrier foil 1, is here at least $0.6 \times 10^{-4}$ and at most $0.8 \times 10^{-4}$.

An electrically conductive contact layer 2 is furthermore arranged on the first surface 11, which contact layer covers the first surface 11 in places and is formed with at least one of the materials Cu, Ag, Au, Ni, Pt, Pd or contains at least one of the stated materials. The electrically conductive contact layer 2 here forms contact points 2A and 2B which are arranged adjacent one another in a lateral direction L and spaced apart from one another on the first surface 11 of the carrier foil 1. "Lateral direction" means in this context a direction parallel to the main direction of extension of the optoelectronic semiconductor device 100. A radiation-emitting, optoelectronic semiconductor component 3 is arranged on an outer face 21, remote from the carrier foil 1, of the contact point 2A. A bonding wire contact 6 creates an electrically conductive connection between the second contact point 2B and the semiconductor component 3. In other words, the semiconductor component 3 is electrically conductively contacted by way of the two contact points 2A and 2B. Vias 4 are provided in the carrier foil 1 beneath each contact point 2A and 2B in a vertical direction V, which vias extend continuously through the carrier foil 1 from the first surface 11 towards the second surface 12. At least one via 4 is associated with each contact point 2A and 2B. In other words, contact points 2A and 2B overlap in the vertical direction V at least in places with the via 4 associated therewith. Connection points A1 and A2 are in each case arranged on the second surface 12 of the carrier foil 1 over the vias 4 in a vertical direction V. In the present case, the connection points A1, A2, the vias 4 and the contact points 2A, 2B in each case form a contacting group. In other words, an electrically conductive connection is created between the connection points A1, A2 and the contact points 2A, 2B in each case associated with the connection points A1, A2 by means of in each case at least one via 4. This means that the optoelectronic, radiation-emitting semiconductor component 3 is externally electrically contactable by way of the connection points A1, A2.

The contact points 2A, 2B are furthermore of a thickness D2 which at most amounts to the thickness D1 of the carrier foil 1. This ensures that the optoelectronic device 100 extends as little as possible in the vertical direction V. Such an optoelectronic semiconductor device 100 is therefore flat and compact.

FIG. 1B is a schematic plan view of the optoelectronic device 100 shown in FIG. 1A. The first surface 11 and the contact points 2A and 2B arranged on the first surface 11 may again be seen, the bonding wire contact 6 not being shown in the present case.

FIG. 2A shows a schematic side view of a further exemplary embodiment of an optoelectronic semiconductor device 100 described herein. In contrast with the exemplary embodiment shown in FIGS. 1A and 1B, the vias 4 are omitted from the exemplary embodiment shown in FIG. 2A. Instead, each contact point 2A, 2B is electrically conductively connected directly to the connection point A1, A2 associated therewith. This means that the contact points 2A, 2B are each formed continuously and integrally with the connection points A1, A2 associated therewith. In other words, the contact points 2A, 2B and the connection Points A1, A2 associated therewith form a unit. To this end, starting from the first surface 11 the contact points 2A and 2B are each guided away from one another along the two surfaces 11 and 12 of the carrier foil 1 and lead directly, i.e., without interruption, into the connection points A1, A2 in each case associated therewith. In other words, contacting groups G1 and G2 formed by the contact points 2A and 2B and the connection points A1, A2 grip the carrier foil 1 laterally at least in places.

FIG. 2B shows a schematic plan view of the exemplary embodiment of the optoelectronic semiconductor component 100 described in FIG. 2A. The contacting groups G1 and G2 which laterally grip the carrier foil 1 are visible here too.

FIGS. 3A and 3B are schematic side views of a signal light 200 described herein. The signal light 200 comprises the optoelectronic semiconductor device 100. The optoelectronic semiconductor device 100 emits electromagnetic radiation of a pre-determinable intensity in the direction of a projection surface 201. Said projection surface 201 is, for example, formed of a glass or radiation-transmissive plastics. The electromagnetic radiation emitted from the optoelectronic semiconductor device 100 is coupled out of the signal light 200 at least in part via the projection surface 201. Both the optoelectronic semiconductor device 100 and the projection surface 201 are bordered in a direction transverse to a radiation exit direction 45 of the optoelectronic semiconductor device 100 by at least one reflecting body 202, the reflecting body 202 concentrating electromagnetic radiation impinging thereon at least in part in the direction of the projection surface 201. The reflecting body 202 is, for example, a light-guiding element or at least part of such an element. In this case, the reflecting body 202 may be an optical fiber or part of an optical fiber.

FIG. 3B shows the signal light 200 in the direction from the projection surface 201 towards the optoelectronic semiconductor device 100, i.e., contrary to the radiation exit direction 45. The optoelectronic semiconductor device 100, which is concealed by the projection surface 201, is in turn shown by dashed lines. The signal light 200 described in FIGS. 3A and 3B is, for example, a motor vehicle headlamp, a luminaire, a motor vehicle rear light or a reading light.

The invention is not restricted by the description given with reference to the exemplary embodiments. Rather, the invention encompasses any novel feature and any combination of features, including in particular any combination of features in the claims, even if this feature or this combination is not itself explicitly indicated in the claims or the exemplary embodiments.

The invention claimed is:

1. An optoelectronic semiconductor device, comprising:
a carrier foil, having a first surface and a second surface opposite the first surface;
an electrically conductive contact layer arranged on the first surface, the contact later covering the first surface in places and containing at least one metal;
a radiation-emitting, optoelectronic semiconductor component arranged on an outer face, which is remote from the carrier foil, of the electrically conductive contact layer;
wherein the radiation-emitting, optoelectronic semiconductor component is electrically conductively connected to the electrically conductive contact layer;
wherein the carrier foil comprises a polymer; and
wherein a monomer of the polymer is formed with at least one C—F bond, with C denoting carbon and F denoting fluorine.

2. The optoelectronic semiconductor device according to claim 1, wherein electromagnetic radiation generated by the radiation-emitting, optoelectronic semiconductor component when in operation impinges on the first surface of the carrier foil, wherein the first surface is formed with the polymer.

3. The optoelectronic semiconductor device according to claim 1, wherein the carrier foil is of reflective construction.

4. The optoelectronic semiconductor device according to claim 3, wherein the carrier foil appears white.

5. The optoelectronic semiconductor device according to claim 1, wherein the polymer is formed with or contains at least one material selected from the group consisting of polytetrafluoroethylene, perfluoropropylene, perfluoroalkyl vinyl ether, polychlorotrifluoroethylene, and polyvinylidene fluoride.

6. An optoelectronic semiconductor device according to claim 1, wherein the carrier foil has a foil thickness of at most 500 μm.

7. The optoelectronic semiconductor device according to claim 1, wherein the electrically conductive contact layer is formed with or contains at least one material selected from the group consisting of Cu, Ag, Au, Ni, Pt, and Pd.

8. The optoelectronic semiconductor device according to claim 1, wherein the thickness of the electrically conductive contact layer amounts at most to the thickness of the carrier foil.

9. The optoelectronic semiconductor device according to claim 1, wherein the dielectric constant of the carrier foil, in the case of electromagnetic radiation impinging on the carrier foil in a frequency range of from at least 50 Hz to at most 1 kHz, amounts to at least 2.0 and at most 2.2 in the CGS system of units.

10. The optoelectronic semiconductor device according to claim 1, wherein the carrier foil has a dielectric dissipation factor, in the case of electromagnetic radiation impinging with a frequency of 1 MHz on the carrier foil, of at least $0.6 \times 10^{-4}$ and at most $0.8 \times 10^{-4}$.

11. The optoelectronic semiconductor device according to claim 1, wherein the electrically conductive contact layer forms a first contact point and a second contact point on the first surface, wherein the radiation-emitting, optoelectronic semiconductor component is electrically conductively connected and/or contactable by way of the first and second contact points.

12. The optoelectronic semiconductor device according to claim 11, wherein a plurality of connection points are arranged on the second surface of the carrier foil and are electrically conductively connected to the first and second contact points.

13. The optoelectronic semiconductor device according to claim 11, wherein a plurality of vias are disposed in the carrier foil, the vias extending completely through the carrier foil from the first surface towards the second surface, wherein a first via electrically conductively connects a contact point associated with the via to a connection point associated with the contact point.

14. The optoelectronic semiconductor device according to claim 13, wherein each contact point is directly electrically conductively connected to the connection point associated therewith.

15. A signal light comprising:
an optoelectronic semiconductor device according to claim 1; and
a projection surface, on which electromagnetic radiation coupled out of the optoelectronic semiconductor device impinges.

16. The signal light according to claim 15, wherein the signal light is used as a light source in a motor vehicle headlamp, a luminaire, a motor vehicle rear light or a reading light.

17. An optoelectronic semiconductor device comprising:
a carrier foil having a first surface and a second surface opposite the first surface;
an electrically conductive contact layer arranged on the first surface, the contact later covering the first surface in places and containing at least one metal;
a radiation-emitting, optoelectronic semiconductor component arranged on an outer face, which is remote from the carrier foil, of the electrically conductive contact layer;
wherein the radiation-emitting, optoelectronic semiconductor component is electrically conductively connected to the electrically conductive contact layer;
wherein the carrier foil is formed with polymer or contains polymer;
wherein a monomer of the polymer is formed with at least one C—F bond, with C denoting carbon and F denoting fluorine; and
wherein electromagnetic radiation generated by the radiation-emitting, optoelectronic semiconductor component when in operation impinges on the first surface of the carrier foil, wherein the first surface is formed with the polymer and the carrier foil is self-supporting.

* * * * *

UNITED STATES PATENT AND TRADEMARK OFFICE
CERTIFICATE OF CORRECTION

PATENT NO. : 8,878,170 B2  
APPLICATION NO. : 13/885659  
DATED : November 4, 2014  
INVENTOR(S) : Klaus Hoehn Page 1 of 1

It is certified that error appears in the above-identified patent and that said Letters Patent is hereby corrected as shown below:

On the Title Page, Item (75) Inventor, delete "Forcheim (DE)" and insert --Forchheim (DE)--.

Claims  
In Col. 9, line 6, claim 1, delete "contact later" and insert --contact layer--.  
In Col. 10, line 36, claim 17, delete "contact later" and insert --contact layer--.

Signed and Sealed this  
Sixth Day of October, 2015

Michelle K. Lee  
*Director of the United States Patent and Trademark Office*